United States Patent
Li et al.

(10) Patent No.: US 9,350,361 B2
(45) Date of Patent: May 24, 2016

(54) CLOCK SIGNAL GENERATING CIRCUIT AND VIDEO SIGNAL PROCESSING CIRCUIT USING SAME

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventors: Jin-Song Li, Shenzhen (CN); Wei Pan, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 185 days.

(21) Appl. No.: 14/141,482

(22) Filed: Dec. 27, 2013

(65) Prior Publication Data
US 2015/0156377 A1    Jun. 4, 2015

(30) Foreign Application Priority Data
Nov. 30, 2013    (CN) .......................... 2013 1 06230591

(51) Int. Cl.
| | |
|---|---|
| H03B 5/36 | (2006.01) |
| H03L 7/00 | (2006.01) |
| H03K 3/02 | (2006.01) |
| H04N 5/04 | (2006.01) |
| H04N 5/073 | (2006.01) |

(52) U.S. Cl.
CPC .. *H03L 7/00* (2013.01); *H03K 3/02* (2013.01); *H04N 5/04* (2013.01); *H04N 5/073* (2013.01)

(58) Field of Classification Search
CPC .......................................................... H03B 5/36
USPC ...................................................... 331/116 R
See application file for complete search history.

(56) References Cited

U.S. PATENT DOCUMENTS

| | | | | |
|---|---|---|---|---|
| 4,199,734 A | * | 4/1980 | Dressen .................... | H03B 5/32 331/116 R |
| 5,712,596 A | * | 1/1998 | Van Amesfoort ...... | H03B 5/368 331/116 R |
| 8,040,197 B2 | * | 10/2011 | Arai ......................... | H03B 5/04 331/116 FE |
| 2013/0258155 A1 | * | 10/2013 | Ueda ........................ | H04N 5/21 348/308 |

FOREIGN PATENT DOCUMENTS

TW    201143272 A1    12/2011

* cited by examiner

*Primary Examiner* — Joseph Chang
(74) *Attorney, Agent, or Firm* — Novak Druce Connolly Bove + Quigg LLP

(57) ABSTRACT

A clock signal generating circuit includes a crystal oscillator, a phase compensation circuit, a negative resistance compensation circuit, and a high pass filter circuit. The crystal oscillator generates a clock signal. The phase compensation circuit compensates a phase of the clock signal. The negative resistance compensation circuit filters phase noises of the clock signal. The high pass filter circuit filters low frequency noises of the clock signal.

18 Claims, 3 Drawing Sheets

CLOCK SIGNAL GENERATING CIRCUIT AND VIDEO SIGNAL PROCESSING CIRCUIT USING SAME

BACKGROUND

1. Technical Field

The present disclosure relates to a clock signal generating circuit and a video signal processing circuit using the clock signal generating circuit.

2. Description of Related Art

A clock signal transmits and processes data in a high speed digital signal processing circuit. When the high speed digital signal processing circuit is a video signal processing circuit for example, the video signal processing circuit modulates video signals based on the clock signal. However, if the clock signal input to the video signal processing circuit has noise, such as phase noise, a quality of the video signals output from the video signal processing circuit is affected.

Therefore, what is needed is a clock signal generating circuit and a video signal processing circuit that can overcome the described limitations.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Reference will now be made to the drawings to describe embodiments of the present disclosure.

Figure 1:
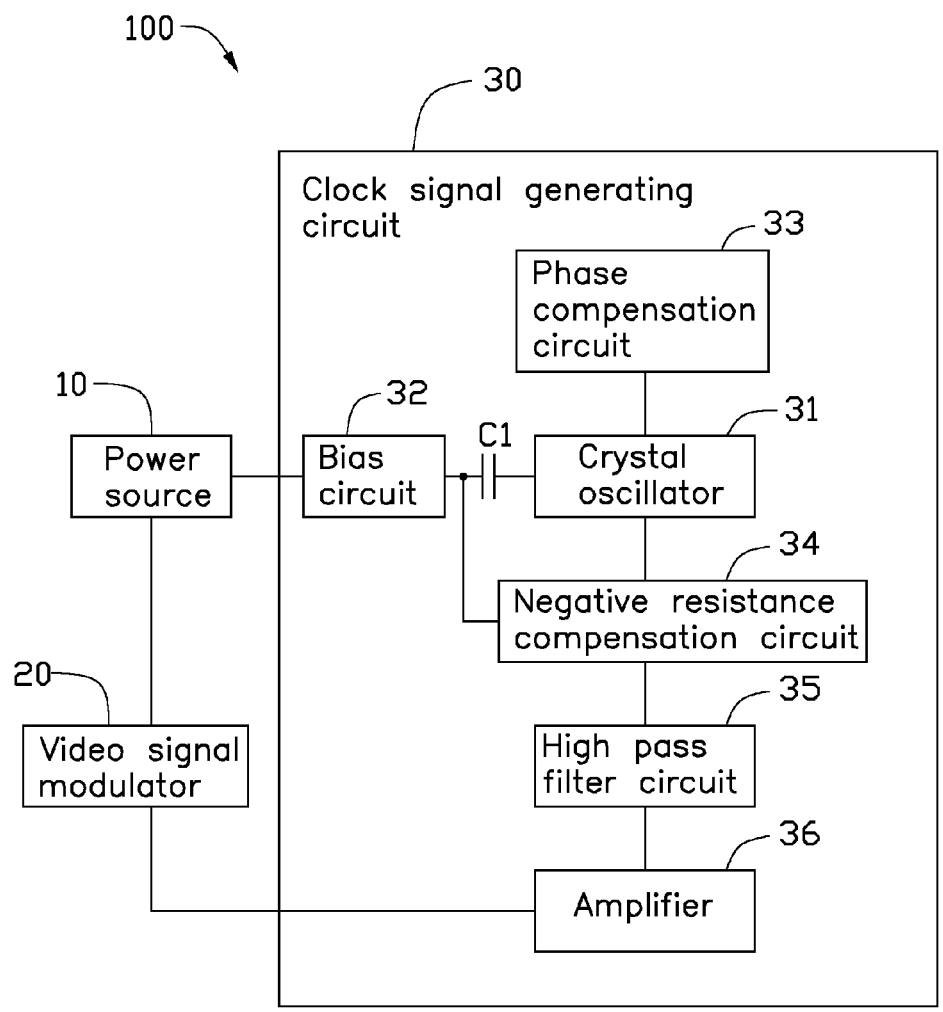
FIG. 1 is a schematic block diagram of an embodiment of a video signal processing circuit.

FIG. 1 illustrates one embodiment of a video signal processing circuit 100. The video signal processing circuit 100 comprises a power source 10, a video signal modulator 20, and a clock signal generating circuit 30. The power source 10 is connected to the video signal modulator 20 and the clock signal generating circuit 30. The clock signal generating circuit 30 is further connected to the video signal modulator 20.

The power source 10 supplies voltage to the video signal modulator 20 and the clock signal generating circuit 30. In one embodiment, the power source 10 is a boost circuit, or a buck circuit.

The clock signal generating circuit 30 comprises a crystal oscillator 31, a bias circuit 32, a first capacitor C1, a phase compensation circuit 33, a negative resistance compensation circuit 34, a high pass filter circuit 35, and an amplifier 36. The bias circuit 32 is connected to the power source 10 and the negative resistance compensation circuit 34, and is further connected to the crystal oscillator 31 via the first capacitor C1. The crystal oscillator 31 is further connected to the phase compensation circuit 33 and the negative resistance compensation circuit 34. The high pass filter circuit 35 is connected between the negative resistance compensation circuit 34 and the amplifier 36. The amplifier 36 is connected to the video signal modulator 20.

The crystal oscillator 31 generates a clock signal. The bias circuit 32 receives the voltage from the power source 10, and outputs a bias voltage to the negative resistance compensation circuit 34. The phase compensation circuit 33 compensates the phase of the clock signal. The negative resistance compensation circuit 34 compensates negative resistance of the clock signal, to decrease phase noises generated by parasitic components, such as parasitic capacitors and parasitic inductors. The high pass filter circuit 35 filters low frequency noises of the clock signal. The amplifier 36 amplifies the clock signal after the clock signal is compensated by the phase compensation circuit 33 and the negative resistance compensation circuit 34, and is filtered by the high pass filter circuit 35, and outputs the amplified clock signal to the video signal modulator 20.

The video signal modulator 20 receives the clock signal from the clock signal generating circuit 30, modulates video signals based on the received clock signal, and outputs the modulated video signals to a display 200. The display 200 displays images based on the modulated video signals.

A first and second embodiments of the clock signal generating circuit 30 are described below. The clock signal generating circuit 30 of the first embodiment is labeled with 30a, and the clock signal generating circuit 30 of the second embodiment is labeled with 30b. Correspondingly, the bias circuit 32 of each of the clock signal generating circuits 30a, 30b is respectively labeled with 32a, 32b. The phase compensation circuit 33 of each of the clock signal generating circuits 30a, 30b is respectively labeled with 33a, 33b. The negative resistance compensation circuit 34 of each of the clock signal generating circuits 30a, 30b is respectively labeled with 34a, 34b. The high pass filter circuit 35 of each of the clock signal generating circuits 30a, 30b is respectively labeled with 35a, 35b.

Figure 2:
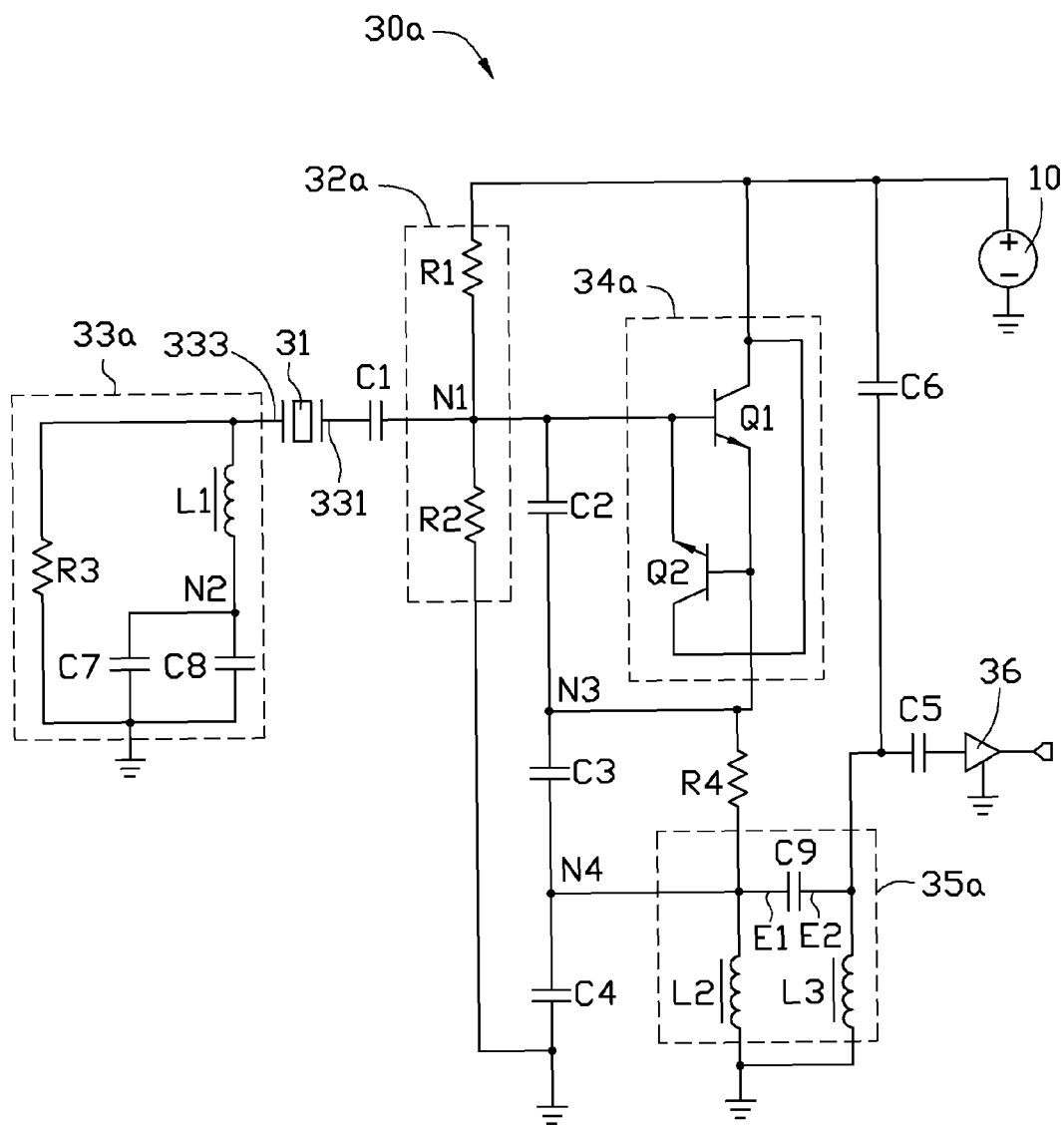
FIG. 2 is a circuit diagram of a first embodiment of a clock signal generating circuit of the video signal processing circuit of FIG. 1.

FIG. 2 is a circuit diagram of a first embodiment of the clock signal generating circuit 30a. The clock signal generating circuit 30a further comprises a second capacitor C2, a third capacitor C3, a fourth capacitor C4, a fifth capacitor C5, and a sixth capacitor C6. The crystal oscillator 31 comprises a first end 331 and a second end 332. The bias circuit 32a comprises a first resistor R1 and a second resistor R2. The first resistor R1 and the second resistor R2 are connected between the power source 10 and ground in series. A first node N1 is defined between the first resistor R1 and the second resistor R2. The first node N1 is connected to the negative resistance compensation circuit 34a and is further connected to the first end 331 of the crystal oscillator 31 via the first capacitor C1.

The phase compensation circuit 33a comprises a third resistor R3, a first inductor L1, a seventh capacitor C7, and an eighth capacitor C8. The third resistor R3 is connected between the second end 333 and ground. The first inductor L1 and the eighth capacitor C8 are connected between the second end 333 and ground in series. A second node N2 is defined between the first inductor L1 and the eighth capacitor C8. The seventh capacitor C7 is connected between the second node N2 and ground. The phase compensation circuit 33a compensates the phase of the clock signal. The clock signal output by the crystal oscillator 31 reaches a predetermined frequency, such as 27 MHz, even as the clock signal is affected by noises when the crystal oscillator 31 generates the clock signal.

The negative resistance compensation circuit 34a comprises a first transistor Q1 and a second transistor Q2. In the embodiment, the first and second transistors Q1, Q2 are NPN bipolar transistors. A base of the first transistor Q1 is connected to the first node N1, and is further connected to ground via the second, third, and fourth capacitors C2, C3, C4 in sequence. A third node N3 is defined between the second capacitor C2 and the third capacitor C3. A fourth node N4 is defined between the third capacitor C3 and the fourth capacitor C4. A collector of the first transistor Q1 is connected to the power source 10. An emitter of the first transistor Q1 is connected to the third node N3. A base of the second transistor Q2 is connected to the third node N3. A collector of the second transistor Q2 is connected to the collector of the first transistor Q1. An emitter of the second transistor Q2 is connected to the base of the first transistor Q1. The clock signal generating circuit 30a further comprises a fourth resistor R4. The fourth resistor R4 is connected to the third capacitor C3 in parallel. The first transistor Q1 filters the phase noises. The second transistor Q2 compensates the clock signal after the clock signal is filter by the first transistor Q1.

The high pass filter circuit 35a is a Π type LC high pass filter. The high pass filter circuit 35a comprises a second inductor L2, a third inductor L3, and a ninth capacitor C9. The second inductor L2 is connected between the fourth node N4 and ground. The ninth capacitor C9 comprises a first end E1 and a second end E2. The first end E1 of the ninth capacitor C9 is connected to the fourth node N4, and the second end E2 of the ninth capacitor C9 is connected to ground via the third inductor L3. The second end E2 of the ninth capacitor C9 is further connected to the amplifier 36 via the fifth capacitor C5, and is further connected to the power source 10 via the sixth capacitor C6.

Figure 3:
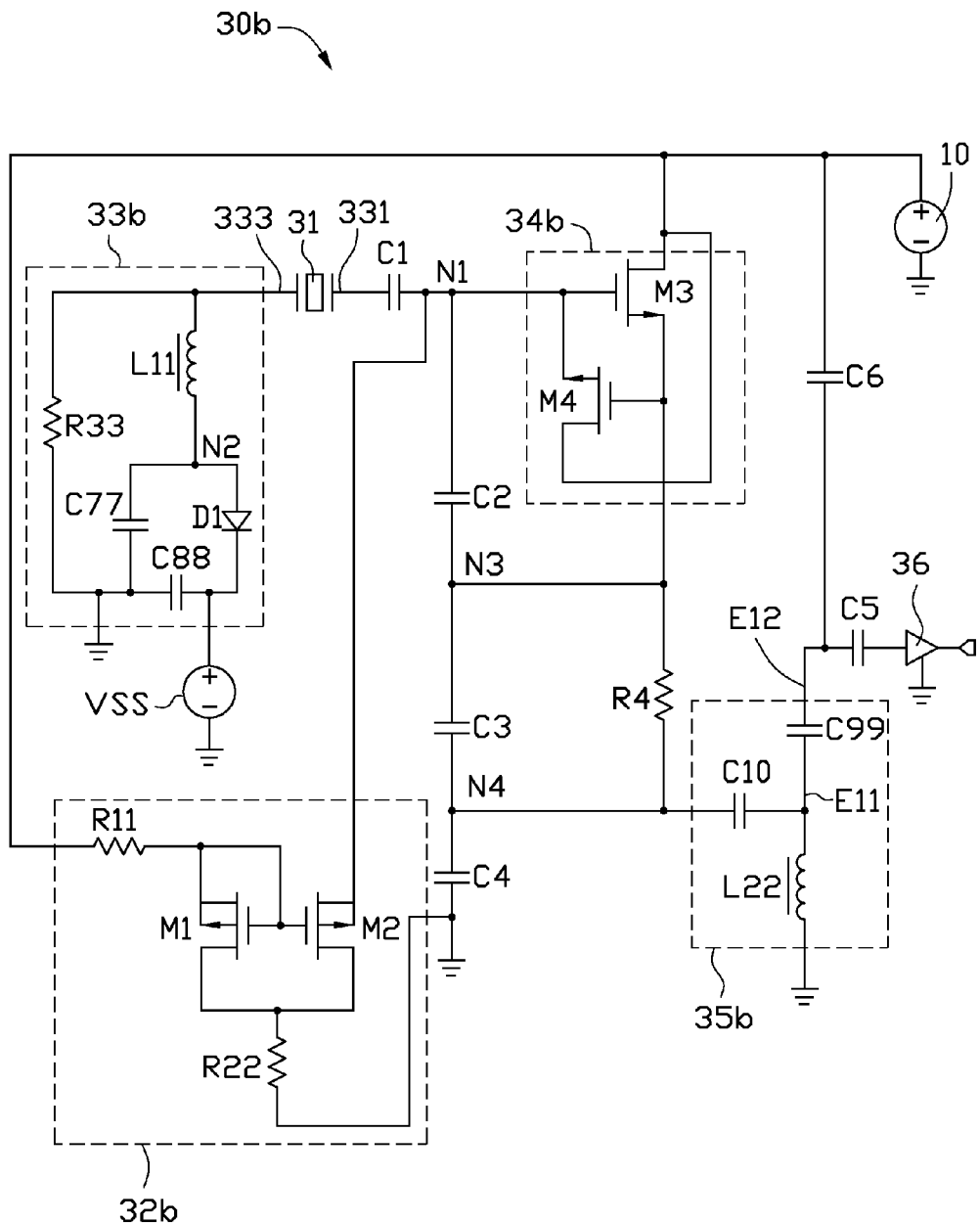
FIG. 3 is a circuit diagram of a second embodiment of a clock signal generating circuit of the video signal processing circuit of FIG. 1

FIG. 3 is a circuit diagram of a second embodiment of the clock signal generating circuit 30b. The second embodiment of the clock signal generating circuit 30b is similar to the first embodiment of the clock signal generating circuit 30a except that the circuits of a bias circuit 32b, a phase compensation circuit 33b, a negative resistance compensation circuit 34b, and a high pass filter circuit 35b differs from circuits of the bias circuit 32a, the phase compensation circuit 33a, the negative resistance compensation circuit 34a, and the high pass filter circuit 35a.

In the embodiment, the bias circuit 32b is current mirror bias circuit. The bias circuit 32b comprises a first transistor M1, a second transistor M2, a first resistor R11, and a second resistor R12. In the embodiment, the first and second transistors M1, M2 are n-channel transistors. A source electrode of the first transistor M1 is connected to the power source 10 via the first resistor R11. A gate electrode of the first transistor M1 is connected to the source electrode of the first transistor M1 and a gate electrode of the second transistor M2. Drain electrodes of the first and second transistor M2, M2 are connected to a first node N1 defined between a first capacitor C1 and the negative resistance compensation circuit 34b via the second resistor R22. A source electrode of the second transistor M2 is connected between a first capacitor C1 and the negative resistance compensation circuit 34b. The source electrode of the second transistor M2 outputs a bias voltage to the negative resistance compensation circuit 34b.

The phase compensation circuit 33b comprises a third resistor R33, a first inductor L11, a variable capacitance diode D1, a seventh capacitor C77, an eighth capacitor C88, and a variable voltage source VSS. The third resistor R33 is connected between a second end 333 of a crystal oscillator 31 and ground. The first inductor L11 and the seventh capacitor C77 are connected between the second end 333 of the crystal oscillator 31 and ground in series. A node N2 is defined between the first inductor L11 and the seventh capacitor C77. An anode of the variable capacitance diode D1 is connected to the second node N2. A cathode of the variable capacitance diode D1 is connected to ground via the eighth capacitor C88, and is further connected to the variable voltage source VSS. A capacitance of the variable capacitance diode D1 is adjustable via adjusting output voltage of the variable voltage source VSS. Accordingly, a frequency and a phase of the clock signal generated by the crystal oscillator 31 are conveniently adjusted.

The negative resistance compensation circuit 34b comprises a third transistor M3 and a fourth transistor M4. In the embodiment, the third and fourth transistors M3, M4 are n-channel transistors. A gate electrode of the third transistor M3 is connected to the first node N1. A source electrode of the third transistor M3 is connected to a third node N3. A drain electrode of the third transistor M3 is connected to the power source 10. A gate of the fourth transistor M4 is connected to the third node N3. A source electrode of the fourth transistor M4 is connected to the first node N1. A drain electrode of the fourth transistor M4 is connected to the power source 10. Operation of the negative resistance compensation circuit 34b is similar to the operation of the negative resistance compensation circuit 34a. Accordingly, the operation of the negative resistance compensation circuit 34b is not repeated here.

The high pass filter circuit 35b is a T type LC high pass filter. The high pass filter circuit 35b comprises a second inductor L22, a ninth capacitor 99, and a tenth capacitor C10. The ninth capacitor C99 comprises a first end E11 and a second end E22. The first end E11 of the ninth capacitor C99 is connected to a fourth node N4 defined between a third capacitor C3 and a fourth capacitor C4 via the tenth capacitor C10. The first end E11 of the ninth capacitor C99 is further connected to ground via the second inductor L22. The second end E12 of the ninth capacitor C99 is connected to the power source 10 via a sixth capacitor C6, and is further connected to the amplifier 36 via a fifth capacitor C5.

The clock signal generating circuit 30 filters phase noises, low frequency noises, and other noises, and thus outputs the clock signal with little or no noise. Accordingly, a quality of the video signals output from the video signal processing circuit based on the clock signal is improved.

It is believed that the present embodiments and their advantages will be understood from the foregoing description, and it will be apparent that various changes may be made thereto without departing from the spirit and scope of the present disclosure or sacrificing all of its material advantages.

What is claimed is:

1. A clock signal generating circuit, comprising:
   a crystal oscillator generating a clock signal;
   a phase compensation circuit compensating a phase of the clock signal;
   a negative resistance compensation circuit filtering phase noises of the clock signal; and
   a high pass filter circuit filtering low frequency noises of the clock signal, wherein the phase compensation circuit comprises a variable voltage source and a variable capacitance diode, the variable voltage source is connected to the variable capacitance diode, and a capacitance of the variable capacitance diode is adjustable via adjusting an output voltage of the variable voltage source.

2. The clock signal generating circuit of claim 1, further comprising a bias circuit and an amplifier, wherein the bias circuit receives a voltage from a power source, and outputs a bias voltage to the negative resistance compensation circuit; the negative resistance compensation circuit filters the phase noises of the clock signal based on the bias voltage; the amplifier amplifies the clock signal after the clock signal is compensated by the phase compensation circuit and is filtered by the negative resistance compensation circuit and the high pass filter circuit.

3. The clock signal generating circuit of claim 2, further comprising a first capacitor, a second capacitor, a third capacitor, a fourth capacitor, a fifth capacitor, a sixth capacitor, and a first resistor; wherein the crystal oscillator comprises a first end and a second end; the first end is connected to the negative resistance compensation circuit via the first capacitor; a first node is defined between the first capacitor and the negative resistance compensation circuit; the second end is connected to the phase compensation circuit; the bias circuit is connected to the negative resistance compensation circuit via the first node; the first node is further connected to ground via the second, third, and fourth capacitors; a second node is defined between the second and third capacitors; a third node is defined between the third and fourth capacitors; the first resistor is connected to the third capacitor in parallel; the high pass filter circuit is connected between the third node and ground, and is further connected to the amplifier via the fifth capacitor and connected to the power source via the sixth capacitor; the negative resistance compensation circuit is further connected between the power source and the second node.

4. The clock signal generating circuit of claim 3, wherein the phase compensation circuit further comprises a first inductor, a second resistor, a seventh capacitor, an eighth capacitor; the second resistor is connected between the second end of the crystal oscillator and ground; the first inductor and the seventh capacitor is connected between the second end of the crystal oscillator and ground in series; a fourth node is defined between the first inductor and the seventh capacitor; an anode of the variable capacitance diode is connected to the fourth node; a cathode of the variable capacitance diode is connected to ground via the eighth capacitor and is further connected to ground via the variable voltage source.

5. The clock signal generating circuit of claim 3, wherein the negative resistance compensation circuit comprises a first transistor and a second transistor; a control end of the first transistor is connected to the first node; a first conductive end of the first transistor is connected to the power source; a second conductive end of the first transistor is connected to the second node; a control end of the second transistor is connected to the second node; a first conductive end of the second transistor is connected to the first conductive end of the first transistor; a second conductive end of the second transistor is connected to the first node.

6. The clock signal generating circuit of claim 3, wherein the high pass filter circuit comprises a ninth capacitor, a second inductor, and a third inductor; the ninth capacitor comprises a first end and a second end; the first end of the ninth capacitor is connected to the third node, and is further connected to ground via the second inductor; the second end of the ninth capacitor is connected to ground via the third inductor, and is further connected to the fifth and sixth capacitors.

7. The clock signal generating circuit of claim 3, wherein the high pass filter circuit comprises a ninth capacitor, a tenth capacitor, and a second inductor; the ninth capacitor comprises a first end and a second end; the first end of the ninth capacitor is connected to the third node via the tenth capacitor, and is further connected to ground via the second inductor; the second of the ninth capacitor is connected to the fifth and sixth capacitors.

8. The clock signal generating circuit of claim 3, wherein the bias circuit comprises a third resistor and a fourth resistor; the third resistor and the fourth resistor are connected between the power source and ground in series; the first node is connected between the first resistor and the second resistor.

9. The clock signal generating circuit of claim 3, wherein the bias circuit comprises a third resistor, a fourth resistor, a third transistor, and a fourth transistor; a control end of the third transistor is connected to the power source via the third resistor; a first conductive end of the third transistor is connected to ground via the fourth resistor; a second conductive end of the third transistor is connected to the control end of the third transistor; a control end of the fourth transistor is connected to the control end of the third transistor; a first conductive end of the fourth transistor is connected to ground via the fourth resistor; a second conductive end of the fourth transistor is connected to the first node.

10. A video signal processing circuit, comprising a clock signal generating circuit and a video signal modulator, the clock signal generating circuit comprising:
    a crystal oscillator generating a clock signal;
    a phase compensation circuit compensating a phase of the clock signal;
    a negative resistance compensation circuit filtering phase noises of the clock signal; and
    a high pass filter circuit filtering low frequency noises of the clock signal, and outputting the clock signal after the clock signal is compensated by the phase compensation circuit, and is filtered by the negative resistance compensation circuit and the high pass filter circuit, wherein the video signal modulator receives the clock signal from the high pass filter circuit and modulates video signals based on the received clock signal, wherein the phase compensation circuit comprises a variable voltage source and a variable capacitance diode, the variable voltage source is connected to the variable capacitance diode, and a capacitance of the variable capacitance diode is adjustable via adjusting an output voltage of the variable voltage source.

11. The video signal processing circuit of claim 10, wherein the clock signal generating circuit further comprises a bias circuit and an amplifier; the bias circuit receives a voltage from a power source, and outputs a bias voltage to the negative resistance compensation circuit; the negative resistance compensation circuit filters the phase noises of the clock signal based on the bias voltage; the amplifier amplifies the clock signal after the clock signal is compensated by the phase compensation circuit and is filtered by the negative resistance compensation circuit and the high pass filter circuit, and outputs the amplified clock signal to the video signal modulator.

12. The video signal processing circuit of claim 11, wherein the clock signal generating circuit further comprises a first capacitor, a second capacitor, a third capacitor, a fourth capacitor, a fifth capacitor, a sixth capacitor, and a first resistor; the crystal oscillator comprises a first end and a second end; the first end is connected to the negative resistance compensation circuit via the first capacitor; a first node is defined between the first capacitor and the negative resistance compensation circuit; the second end is connected to the phase compensation circuit; the bias circuit is connected to the negative resistance compensation circuit via the first node; the first node is further connected to ground via the second, third, and fourth capacitors; a second node is defined between the second and third capacitors; a third node is defined between the third and fourth capacitors; the first resistor is connected to the third capacitor in parallel; the high pass filter circuit is connected between the third node and ground, and is further connected to the amplifier via the fifth capacitor and connected to the power source via the sixth capacitor; the negative resistance compensation circuit is further connected between the power source and the second node.

13. The video signal processing circuit of claim 12, wherein the phase compensation circuit further comprises a first inductor, a second resistor, a seventh capacitor, an eighth capacitor; the second resistor is connected between the second end of the crystal oscillator and ground; the first inductor and the seventh capacitor is connected between the second end of the crystal oscillator and ground in series; a fourth node is defined between the first inductor and the seventh capacitor; an anode of the variable capacitance diode is connected to the fourth node; a cathode of the variable capacitance diode is connected to ground via the eighth capacitor and is further connected to ground via the variable voltage source.

14. The video signal processing circuit of claim 12, wherein the negative resistance compensation circuit comprises a first transistor and a second transistor; a control end of the first transistor is connected to the first node; a first conductive end of the first transistor is connected to the power source; a second conductive end of the first transistor is connected to the second node; a control end of the second transistor is connected to the second node; a first conductive end of the second transistor is connected to the first conductive end of the first transistor; a second conductive end of the second transistor is connected to the first node.

15. The video signal processing circuit of claim 12, wherein the high pass filter circuit comprises a ninth capacitor, a second inductor, and a third inductor; the ninth capacitor comprises a first end and a second end; the first end of the ninth capacitor is connected to the third node, and is further connected to ground via the second inductor; the second end of the ninth capacitor is connected to ground via the third inductor, and is further connected to the fifth and sixth capacitors.

16. The video signal processing circuit of claim 12, wherein the high pass filter circuit comprises a ninth capacitor, a tenth capacitor, and a second inductor; the ninth capacitor comprises a first end and a second end; the first end of the ninth capacitor is connected to the third node via the tenth capacitor, and is further connected to ground via the second inductor; the second of the ninth capacitor is connected to the fifth and sixth capacitors.

17. The video signal processing circuit of claim 12, wherein the bias circuit comprises a third resistor and a fourth resistor; the third resistor and the fourth resistor are connected between the power source and ground in series; the first node is connected between the first resistor and the second resistor.

18. The video signal processing circuit of claim 12, wherein the bias circuit comprises a third resistor, a fourth resistor, a third transistor, and a fourth transistor; a control end of the third transistor is connected to the power source via the third resistor; a first conductive end of the third transistor is connected to ground via the fourth resistor; a second conductive end of the third transistor is connected to the control end of the third transistor; a control end of the fourth transistor is connected to the control end of the third transistor; a first conductive end of the fourth transistor is connected to ground via the fourth resistor; a second conductive end of the fourth transistor is connected to the first node.

* * * * *